United States Patent
Lin (10) Patent No.: US 8,688,254 B2
(45) Date of Patent: Apr. 1, 2014

(54) MULTIPLE TOOLS USING A SINGLE DATA PROCESSING UNIT

(75) Inventor: Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 676 days.

(21) Appl. No.: 11/871,360

(22) Filed: Oct. 12, 2007

(65) Prior Publication Data
US 2008/0311314 A1 Dec. 18, 2008

Related U.S. Application Data

(60) Provisional application No. 60/944,275, filed on Jun. 15, 2007.

(51) Int. Cl.
| G06F 19/00 | (2011.01) |
| B05B 5/025 | (2006.01) |
| B05C 5/00 | (2006.01) |
| B05C 9/08 | (2006.01) |
| B05C 11/00 | (2006.01) |
| C23C 14/30 | (2006.01) |
| H05B 7/00 | (2006.01) |

(52) U.S. Cl.
USPC .............. 700/96; 118/620; 118/696; 427/596

(58) Field of Classification Search
USPC ....................... 700/96; 118/620, 696; 427/596
See application file for complete search history.

(56) References Cited

U.S. PATENT DOCUMENTS

| 6,478,418 | B2 * | 11/2002 | Reboa et al. | 347/100 |
| 6,829,181 | B1 * | 12/2004 | Seitoh | 365/201 |
| 7,249,342 | B2 * | 7/2007 | Pack et al. | 716/52 |
| 2002/0155629 | A1 * | 10/2002 | Fairbairn et al. | 438/14 |
| 2002/0187406 | A1 * | 12/2002 | Magome et al. | 430/5 |
| 2003/0145791 | A1 * | 8/2003 | Shinya et al. | 118/724 |
| 2003/0152851 | A1 * | 8/2003 | Ikeda | 430/30 |
| 2003/0207747 | A1 * | 11/2003 | Wu et al. | 501/56 |
| 2004/0027681 | A1 * | 2/2004 | Sunagawa et al. | 359/643 |
| 2004/0107412 | A1 | 6/2004 | Pack et al. | |
| 2004/0189973 | A1 * | 9/2004 | Fukui | 355/72 |
| 2004/0240099 | A1 * | 12/2004 | Brannon et al. | 360/75 |
| 2006/0011645 | A1 * | 1/2006 | Shimada | 221/121 |
| 2006/0093378 | A1 * | 5/2006 | Sicard et al. | 398/195 |
| 2006/0212613 | A1 * | 9/2006 | Stewart | 710/29 |

(Continued)

FOREIGN PATENT DOCUMENTS

| CN | 1467532 | 1/2004 |
| CN | 1532633 | 9/2004 |
| CN | 1892982 | 1/2007 |
| JP | 2007110079 | 4/2007 |

OTHER PUBLICATIONS

Taiwan Patent Office, Office Action dated Oct. 17, 2012, Application No. 10121106440, 13 pages.

Primary Examiner — Kavita Padmanabhan
Assistant Examiner — Jason Lin
(74) Attorney, Agent, or Firm — Haynes and Boone, LLP (57) ABSTRACT

A method and system for simultaneously processing multiple substrates through an imaging beam process is provided. The system includes a plurality of direct write substrate exposure modules configured to receive a writing instruction from a data processing unit. The system and method of the invention utilizes multiple exposure modules receiving writing instructions from a single common data processing unit.

18 Claims, 9 Drawing Sheets

(56) References Cited

U.S. PATENT DOCUMENTS

| | | | |
|---|---|---|---|
| 2006/0273248 A1* | 12/2006 | Rueb et al. | 250/236 |
| 2007/0007646 A1* | 1/2007 | Yamaguchi et al. | 257/727 |
| 2007/0009651 A1* | 1/2007 | Miyata | 427/8 |
| 2007/0011112 A1* | 1/2007 | Yoshida et al. | 706/13 |
| 2007/0162175 A1* | 7/2007 | Segawa et al. | 700/121 |
| 2009/0162759 A1* | 6/2009 | Ogata et al. | 430/30 |

* cited by examiner

MULTIPLE TOOLS USING A SINGLE DATA PROCESSING UNIT

CROSS REFERENCE TO RELATED APPLICATIONS

This application claims the benefit of the filing date of U.S. provisional patent application Ser. No. 60/944,275, filed on Jun. 15, 2007.

BACKGROUND

Photolithography or optical lithography is generally known as a process that is used in micro fabrication to selectively remove parts of thin films on a substrate. Photolithography generally uses a directed light source to transfer a geometric pattern from a photomask to a light-sensitive chemical resist material that is deposited on the substrate, thus generating an exposure pattern in the resist material from the light. A series of chemical treatments may then be used to etch or otherwise transfer the exposure pattern into one or more thin film layers positioned underneath the resist layer.

More recent lithography-type systems for micro fabrication operate to transfer or generate an exposure pattern in a resist layer without the intermediary step of creating a photomask. For example, a direct-write (DW) exposure tool operates to write patterns directly into one or more layers on a substrate (without a mask). The pattern is generally written from an electronic or computer-type file that is used to control a precision exposure source that may be selectively directed onto the layers of the substrate. More particularly, a DW exposure tool is generally configured such that the exposure of a circuit pattern is made not by illumination of the photoresist through a mask or film negative of the circuit, but rather by directly and selectively exposing the desired areas of the resist or other layer on a substrate with a focused beam of the appropriate energy and dosage to create the desired circuit pattern.

Figure 1:
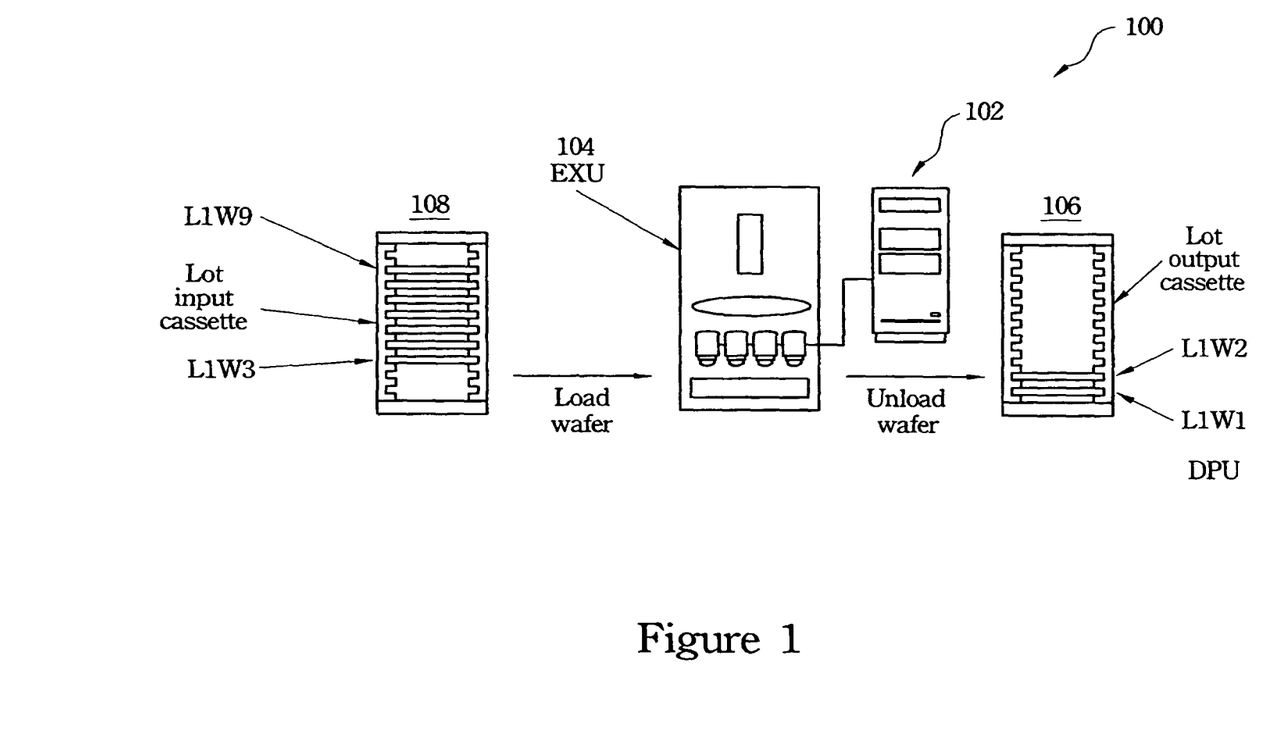
FIG. 1 illustrates an exemplary EXU system.

An exemplary DW system is illustrated in FIG. 1. The DW system 100 generally includes an exposure unit 104 (EXU), which generally includes at least one energized beam, such as photon, electron, or ion beam that generally passes through at least one imaging head configured to focus the beam onto a recording medium on a substrate. The exemplary system 100 may also include a data-processing unit 102 (DPU) that is configured to read patterning data from a data storage medium, which may be within the DPU 102 or remotely positioned and in communication with the DPU 102. The DPU 102 takes the patterning data and loads it into its memory, generates a pattern writing instruction set, and sends the writing instruction set to the EXU 104. Depending on the form of the stored patterning data, when the patterning data includes an EXU writing instruction, the function of the DPU is reading, loading, and sending, as noted above. However, when the stored pattern data is a raw GDS-type file from a circuit designer, then the DPU 102 may also perform proximity correction and transformation to writing instruction instructions for the EXU 104. Alternately, the proximity correction and transformation can be performed separately by a standalone module. The EXU 104 receives the writing instruction from the DPU 102 and converts the writing instruction into control signals that are used to control the writing beam to write the pattern onto the substrate.

Substrates are sequentially loaded into the system 100 via an input cassette 108 by a substrate transfer mechanism (not shown). The substrate(s) are sequentially processed in the EXU 104 and are then unloaded from the EXU 104 by another substrate transfer mechanism (not shown). The processed substrates are positioned in an output cassette 106 and are generally positioned in the output cassette 106 in the same order the substrates were positioned in the input cassette 108. For example, the substrates in the input cassette 108 are generally removed sequentially, i.e., Lot 1, Wafer/substrate 1 (L1W1) is removed and processed first, and then Lot 2, Wafer/substrate 2 is removed and processed second. This process generally continues until each wafer/substrate in the input cassette 108 has been processed and positioned in the output cassette 106.

Although direct-writing EXU systems are efficient in that they generally eliminate photolithographic masking steps from semiconductor processing, there are several disadvantages to direct-writing EXU systems. For example, given the size (in memory space required) of the patterning data and the writing instruction, the DPU is often very large and expensive as a result of the memory and processing power required to work with the patterning data and writing instructions. More particularly, in order for an EXU system to operate efficiently, generally the DPU for the system will be capable of processing data in multiple terra bits per second, i.e., over 1000 gigabits per second. This magnitude of processing inherently generates heat and requires cooling to prevent failure of the processing mechanisms of the DPU. Additionally, the large processing power and memory required to process the patterning data and writing instruction is very expensive.

Therefore, in view of the challenges presented by DPUs of EXU systems, it would be desirable to have an EXU system that utilizes multiple EXU modules controlled by a single DPU.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Exemplary embodiments of the invention may use a direct-writing cluster (DWC) that includes one DPU that operates to control or drive multiple EXUs. This configuration saves space, cost, and power and to allows for parallel processing of substrates in multiple EXUs, while still providing for reassembly of the substrates after exposure in a cassette in the same order as the substrates were delivered to the processing station in a similar cassette, i.e., the cassette leaving the cluster will have the same substrates as the cassette delivered to the cluster, with the substrates in the same position, however, the substrates are obviously processed in the output cassette.

Prior to addressing the specific embodiments of the invention, Applicants note that it is to be understood that the following disclosure provides many different embodiments, or examples, for implementing different features of various embodiments of the invention. The exemplary embodiments described herein discuss components and arrangements only as examples, and are of course, not intended to be limiting. In addition, the present disclosure may repeat reference numerals and/or letters in the various exemplary embodiments. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Similarly, method steps or program step execution sequences that are not expressly recited as being in a specific order may be conducted in various sequences and are not intended to be limited by the order in which they are described in the exemplary embodiments of the invention discussed herein.

Further, at least one embodiment of the present disclosure may be implemented as a program product for use with a computer system or other type of processing device. The program product may generally be configured to define functions of the embodiments (including the methods) described herein and can be contained on a variety of computer readable media. Illustrative computer readable media include, without limitation, (i) information permanently stored on non-writable storage media (e.g., read-only memory devices within a computer such as CD-ROM disks readable by a CD-ROM drive, or programmable logic devices); (ii) alterable information stored on writable storage media (e.g., floppy disks within a diskette drive or hard-disk drive, writable CD-ROM disks and DVD disks, zip disks, and writable portable memory devices); and (iii) information conveyed across communications media, (e.g., a computer, telephone, wired network, or wireless network). These embodiments also include information shared over the Internet or other computer networks, systems, and computers. Therefore, Applicants intend that any computer readable media, when carrying computer-readable instructions that are capable of performing methods or operations associated with the embodiments of the present disclosure when the instructions are executed by a processor, represent an exemplary embodiment of the present disclosure.

Further still, in general, software routines implementing various elements, parts, or embodiments of the present disclosure may be included as part of a computer operating system or as part of a specific application, component, program, module, object, or sequence of instructions, such as an executable script. Software routines typically include a plurality of instructions capable of being performed using a computer system or other type of processor configured to execute instructions read from a computer readable medium. Also, programs typically include or interface with variables, data structures, other computer programs that reside in a memory or on storage devices as part of their operation. In addition, various programs described herein may be identified based upon the application for which they are implemented. Those skilled in the art will readily recognize, however, that any particular nomenclature or specific application that follows facilitates a description of embodiments of the present disclosure and does not limit the embodiments for use solely with a specific application or nomenclature. Furthermore, the functionality of programs described herein may use a combination of discrete modules or components interacting with one another. Those skilled in the art will recognize, however, that different embodiments may combine or merge such components or modules in a variety of ways not expressly recited in the exemplary embodiments described herein. Additionally, the terms wafer and substrate are used herein interchangeably and are generally intended to represent any surface that may be used to form semiconductor devices thereon through a plurality of layer deposition, etching, and/or lithography steps, such as silicon substrates or other wafers, for example.

Figure 2:
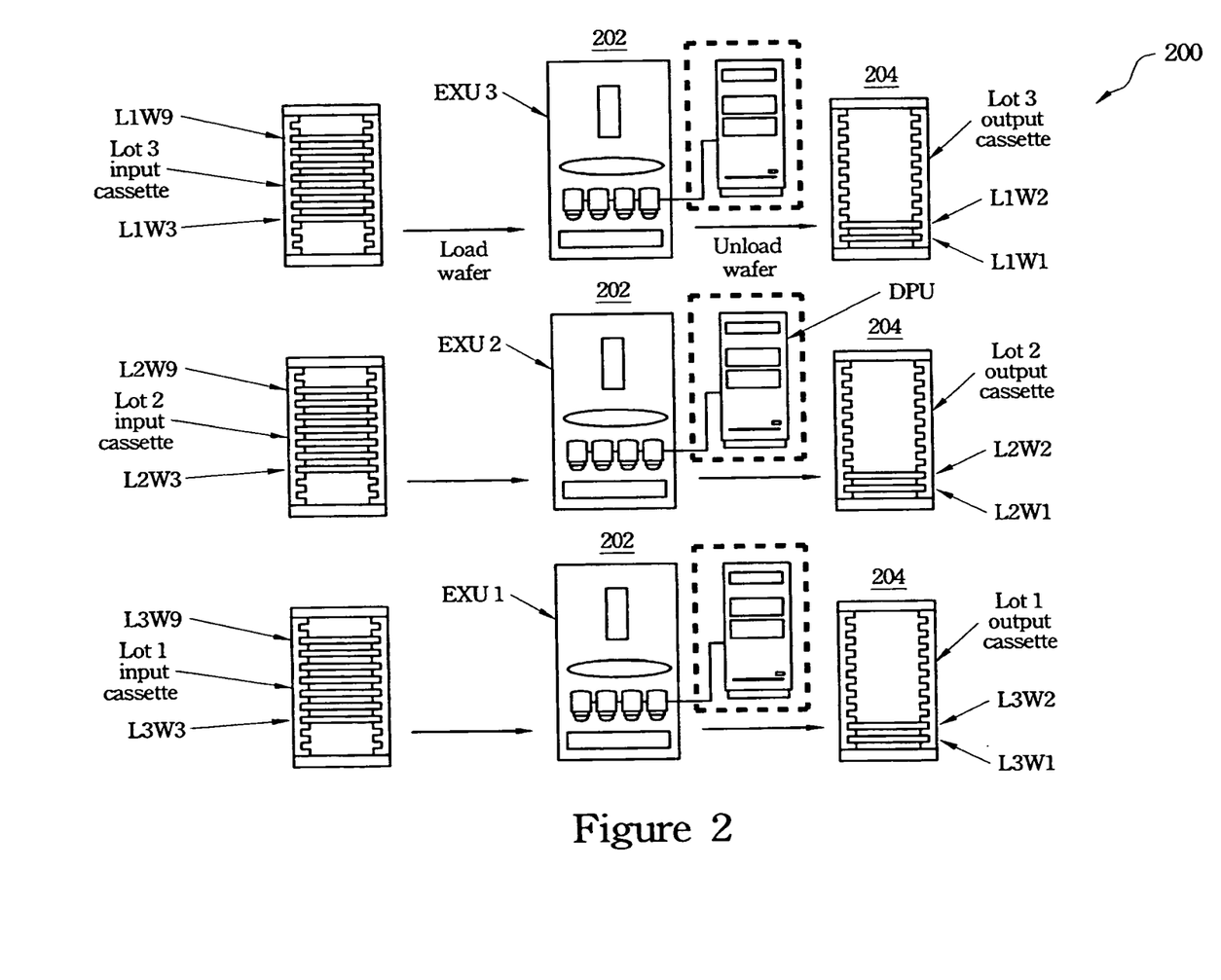
FIG. 2 illustrates an exemplary EXU system having multiple EXU modules and a single DPU controlling each EXU.

FIG. 2 illustrates an exemplary EXU system 200 having multiple EXU modules 202 and a single DPU 204 controlling each EXU 202. In the exemplary embodiment illustrated in FIG. 2, three exposure tools are used as an example, however there is not a limit to the number of tools that can be used in this configuration. In operation, when there are three lots of wafers to process, there are three separate cassettes containing the three lots of wafers or substrates. The substrates are named LmWn, denoting the $n^{th}$ substrate/wafer of the $m^{th}$ lot. These three lots are processed independently of each other in the configuration of system 200. For example, in the exemplary illustration of system 200 in FIG. 2, the first two substrates from each of the three lots have been sent from the input cassettes into the three EXU modules 202. After exposure, the substrates are sent out to the three output cassettes such that L1W1 and L1W2 are in the same output cassette, L2W1 and L2W2 are in the same cassette, and L3W1 and L3W2 are in the same cassette. Thus, the exemplary system 200 uses a bank of EXU modules 202, where each EXU module 202 has its own DPU 204, and substrates from specific lots are exclusively processed through an associated EXU 202, i.e., substrates from lot 1 are processed in EXU #1 exclusively and no other lots are processed in EXU #1 while the substrates from lot 1 are being processed. The patterns to be written on these wafers can be separately assigned by each DPU. Although the patterns may be different in each lot, the present exemplary embodiment will be described with respect to identical pattering, however, it is to be noted that the invention is not in any way limited by the exemplary discussion of an embodiment where an identical pattern is used. For different lots, the pattern may be identical or different, depending on the quantity of wafers to be written with identical patterns.

Figure 3:
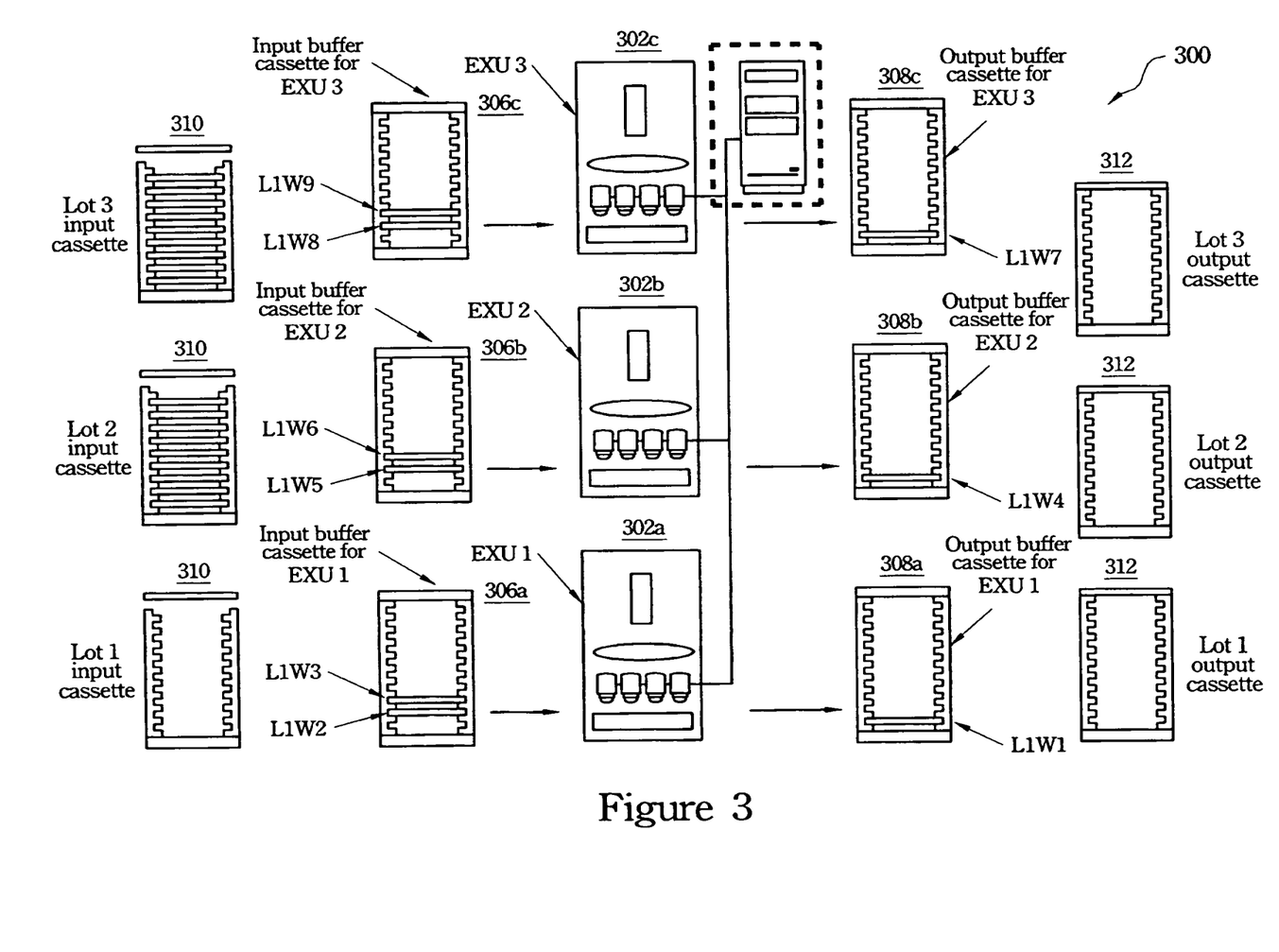
FIG. 3 illustrates an exemplary EXU system of the invention using multiple EXU modules controlled by a single DPU.

FIG. 3 illustrates an exemplary EXU system 300 of the invention using multiple EXU modules 302 controlled by a single DPU 304. The single DPU 302 is generally configured to send a writing instruction, which may be identical, to each of the three EXU modules 302 to write three wafers simultaneously. Although the present exemplary embodiment illustrates three EXU modules 302, embodiments of the invention are not limited to any particular number of EXU modules 302. The substrates transferred to the EXU modules 302 may be from separate lots if the patterns to be written are identical across lots, or as shown in the embodiment illustrated in FIG. 3, the simultaneously processed substrates may be from the same lot. For example, the exemplary embodiment illustrated in FIG. 3 shows substrates L1W1, L1W2, and L1W3 all loaded into a first input buffer cassette 306a associated with a first EXU 302a. Similarly, the next three substrates from lot 1 are loaded into the input buffer cassette 306b associated a second EXU 302b, and the final three substrates are loaded into the input buffer cassette 306c associated with the third EXU 302c. Applicants note that a cassette with nine substrates is shown only as an example, and cassettes with any number of substrates may be used without departing from the scope of the invention.

Therefore, in the exemplary configuration shown in FIG. 3, L1W1, L1W4, and L1W7 are written simultaneously from one single DPU writing instruction that is communicated to three separate EXU modules 302a, 302b, & 302c. Similarly, L1W2, L1W5, and L1W8 are written simultaneously in the same EXU modules 302a, 302b, & 302c after the first three substrates are processed. This substantially simultaneous processing scheme continues until all of the substrates in a particular lot have been processed through the EXU modules 302 and have been positioned in an output cassette 312. Therefore, as shown in FIG. 3, the substrates from lot 1 may all be removed from the input cassette 310, processed through EXU modules (302a, 302b, & 302c), and then returned to an output cassette 312 in the same order as they substrates were in the input cassette 310.

Since the substrates in a particular lot are processed simultaneously in at least one embodiment of the invention, input buffer cassettes 306 and output buffer cassettes 308 may be used to facilitate the processing method. More particularly, since the single DPU 308 of this embodiment of the invention is configured to send the same writing instruction simultaneously to three EXU modules (302a, 302b, & 302c), then it is desirable for substrates to be expeditiously positioned in the EXU modules 302 for processing so that the processing modules are not waiting for substrates to begin processing. This waiting is undesirable, as in an embodiment where one writing instruction is sent to three EXU modules 302, generally none of the EXU modules will begin processing until all three modules are loaded and ready. Therefore, at least one embodiment of the invention may use input buffer cassettes 306 to facilitate staging of the substrates prior to processing by the EXU modules 302 so that a continuous flow of substrates may be provided to the EXU modules 302 and production throughput may be maximized. Additionally, the input buffer cassettes 306 also allow for neighboring substrates in a lot to generally be processed by the same EXU module 302, i.e., groups of substrates in a lot are each processed by the same EXU, which makes defect detection and process changes that result therefrom easier to implement. Alternatively, substrates may be processed individually and not in groups, i.e., substrates 1, 4, and 7 of lot 1 may be processed by EXU 1, substrates 2, 5, and 8 may be processed by EXU 2, and substrates 3, 6, and 9 may be processed by EXU 3.

Similarly, after all of the substrates in a lot are processed by system 300, it may be desirable to reposition the substrates in an output cassette 312 in the same order and position the substrates were in when they were brought to system for processing, i.e., in the same position and order as they were in the input cassette. Therefore, at least one embodiment of the invention uses output buffer cassettes 308 to temporarily store substrates after they are removed from the EXU modules 302. The substrates may be removed from the output buffer cassettes 308 and transferred to a selected output cassette 312 and positioned therein in an appropriate order, which may be the same order as the substrates were in when the substrates were in the input cassette 310. The process of transferring substrates between the cassettes and the EXU modules may generally be conducted by a substrate transfer mechanism, such as by a wafer robot, conveyor, or other device that is generally used to transfer substrates in a semiconductor processing system. Additionally, although the exemplary embodiment illustrated in FIG. 3 shows three input buffer cassettes 306 and three output buffer cassettes 308, the invention is not limited to any particular number of buffer cassettes on either the input or output side.

Figure 4A:
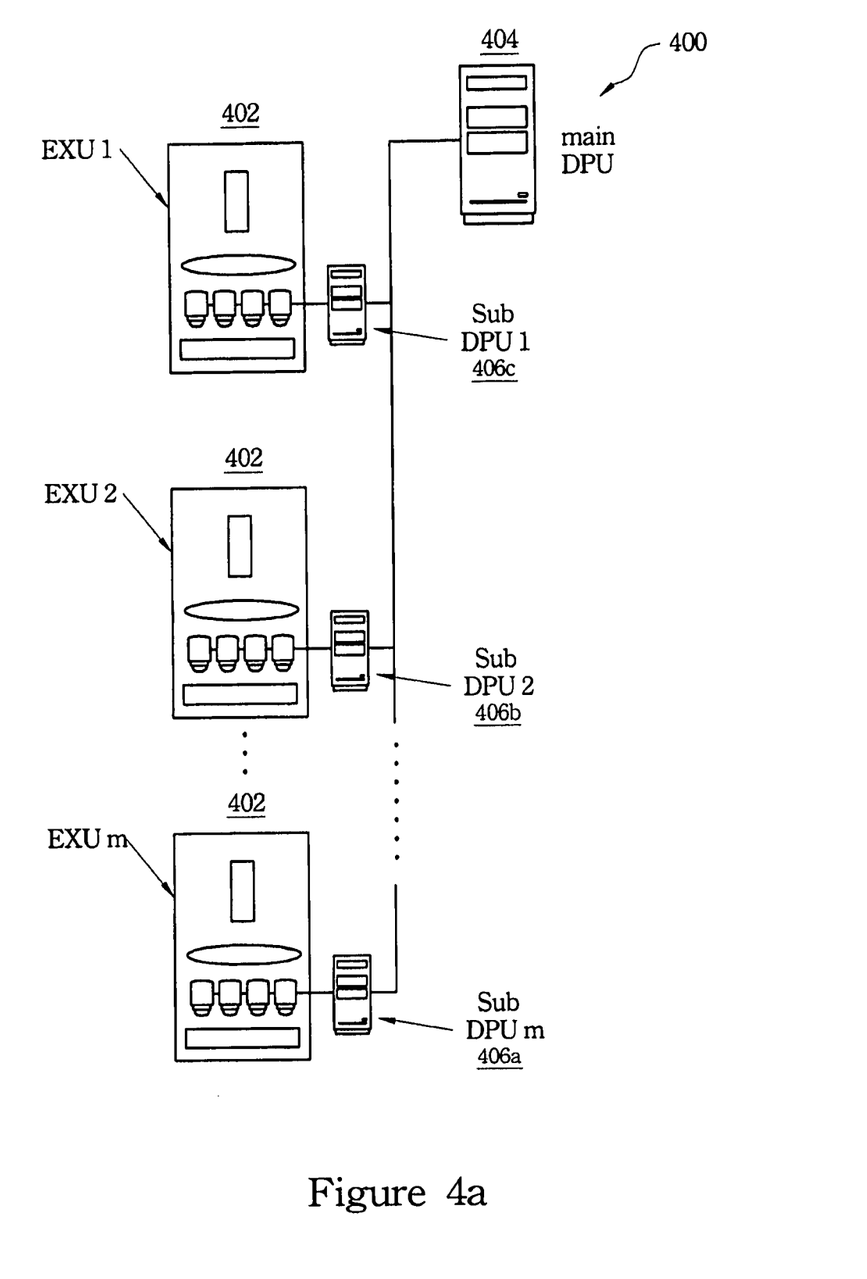
FIGS. 4a and 4b illustrate additional exemplary embodiments of multiple EXU processing systems of the invention.
Figure 4B:
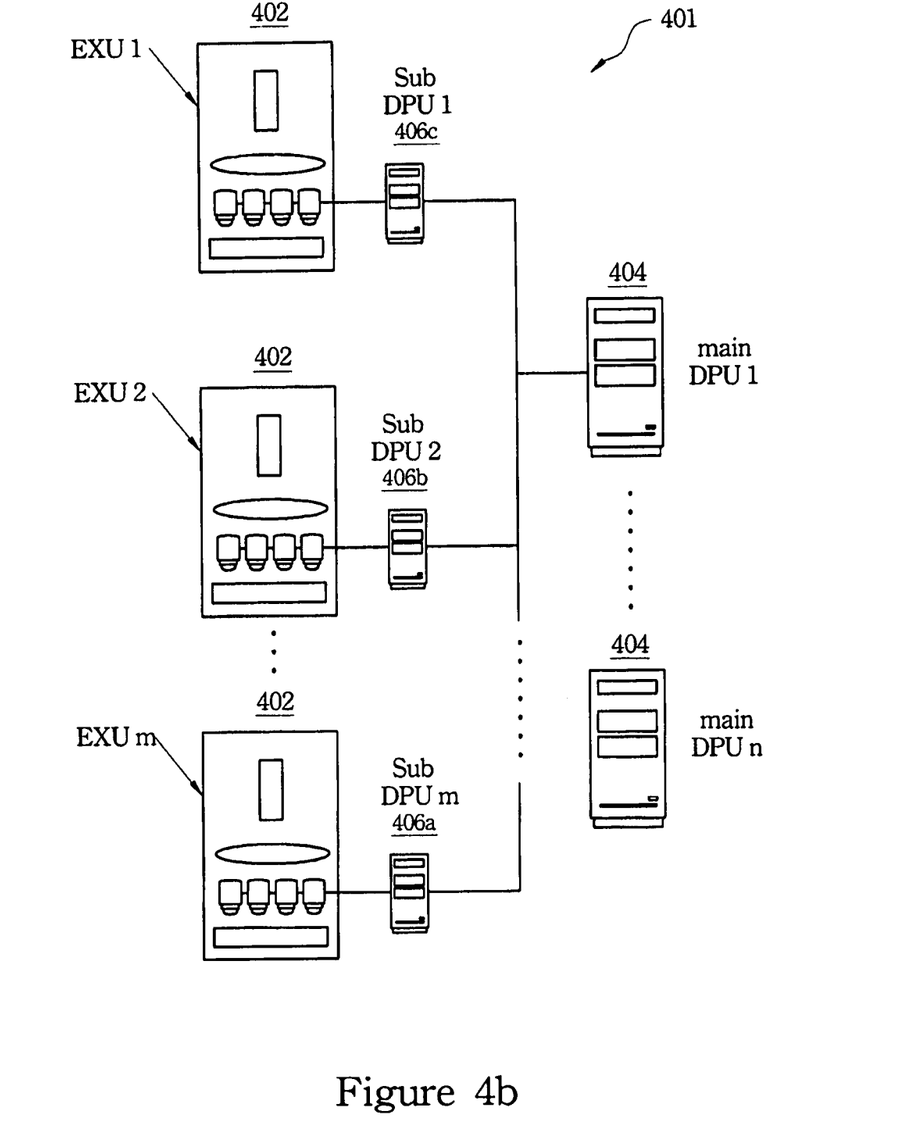

FIGS. 4a and 4b illustrate exemplary embodiments of multiple EXU processing systems of the invention. FIG. 4a shows a multiple EXU system 400 where a plurality of EXU modules 402 are in communication with a single DPU 404. However, the system 400 also includes at least one (optional) sub-DPU 406 positioned between the EXU modules 402 and the main DDPU 404. More particularly, system 400 uses one main DPU 404 and three sub-DPUs 406a, 406b, and 406c, where each sub DPU is associated with a single EXU module 402. Therefore, embodiments of the invention may include "n" main DPUs 404 serving "m" EXU modules 402, and sub-DPUs as necessary, where "n" is less than "m" (and greater than 1).

FIG. 4b illustrates another exemplary embodiment of the invention where more than one main DPU 404 operates to send writing instructions to the EXU modules 402. The exemplary system 401 illustrated in FIG. 4b may be used when the number of substrates of identical design is not an integer multiple of the number of EXU modules 402. Therefore, system 401 may be used to simultaneously process substrates in multiple EXU modules 402, where the substrates being processed do not have identical writing instructions. More particularly, the use of multiple main DPUs 404 allows for multiple (different) writing instructions to be sent to multiple EXU modules 402. System 401 still allows for a single instruction to be sent from a main DPU 404 to multiple EXU modules 402 to simultaneously process substrates with a common or identical writing instruction. However, system 401, through the additional main DPUs 404, provides the ability to both process identical substrates simultaneously, while also processing substrates with a different pattern and writing instruction. For example, the substrates being processed in EXU 1 and EXU 2 may have identical patterns, while substrates being processed in EXU 3 and other EXU modules may have a different pattern and writing instruction. Thus, the writing instruction for EXU 1 and EXU 2 may be generated by main DPU 1, while the writing instruction for EXU 3 and the other EXUs may be generated by a second main DPU 404. In this embodiment, the substrates processed in each of the EXU modules 402 may still be processed simultaneously, despite having different writing instructions.

System 401 may also provide improved flexibility in routing the substrates to the various EXU modules 402, as the substrates are not required to go to a specific EXU module 402 as a result of a specific pattern and associated writing instruction. With more than one main DPU 404, the writing instruction for each substrate may be different and may be sent to any DPU, i.e., the EXU modules 402 are not required to process substrates using identical writing instructions. Therefore, the number of main DPUs required for a system may generally be equal to the number of required writing instructions. However, the number of main DPUs 404 will generally be kept to a minimum to reduce the cost associated with the system 401.

In the exemplary embodiment of the invention illustrated in FIGS. 4a and 4b, generally the main DPU 404 operates to read a GDS-type file from storage into an electronic memory. The main may DPU 404 decompress the data from the GDS file, incorporate proximity correction information, and generate an on-off stream for each beam of the EXU module, along with stage movement information to control the movement of the substrate under the beam during processing. The main DPU 404 converts the electrical signals for the beam and stage control into an optical signal, which may be referred to as a writing instruction, and sends it through an optical fiber to the respective EXU modules that are processing substrates with the particular writing instruction. Thus, the main DPU 404 reads the GDS file from storage into electronic memory, decompresses the data read, incorporates proximity correction, and generates on-off stream for each beam and instruction of stage movement. It turns the on-off stream electrical signal into optical signal to send through the optical fiber to each EXU 402.

In the exemplary embodiment of the invention illustrated in FIGS. 4a and 4b, the sub-DPU 406 generally operates to control and fine-tune the blanking of the imaging beams on and off according to the signal from the optical fiber that was generated by the main DPU 404. Additionally, the sub-DPU 406 also operates to drive or move the substrate stage or table in accordance with the writing instruction received from the optical fiber connecting the sub-DPU 406 to the main DPU 404. It also fine-tunes the movement according to specific variation between the stages of the different EXUs. With regard to alignment, the sub-DPU 406 operates to adjust the stage position for alignment to a previous layer according to rotation, magnification, and x-y shift parameters taken during alignment. Additionally, the sub-DPU 406 also operates to control and fine tune the intensity, current, spot size, aberration, and position of each of the optical beams used in processing the substrate. As such, the sub-DPU 406 may be a local processing control module that receives the writing instruction and controls the substrate processing parameters in accordance with the writing instruction. The sub-DPU 406, however, generally does not create the writing instructions or process GDS data like the main DPU 404. In other systems, the functions of the main DPU and the sub-DPU are incorporated in a single DPU. Whereas in at least one embodiment of the current invention, the common functions are extracted and incorporated in the main DPU, while functions needed for each EXU are retained in the sub-DPU and remain at each EXU. This reduces the processing requirements on the distributed DPU in prior art, and therefore, increases the efficiency of the system while also reducing the cost.

Figure 5:
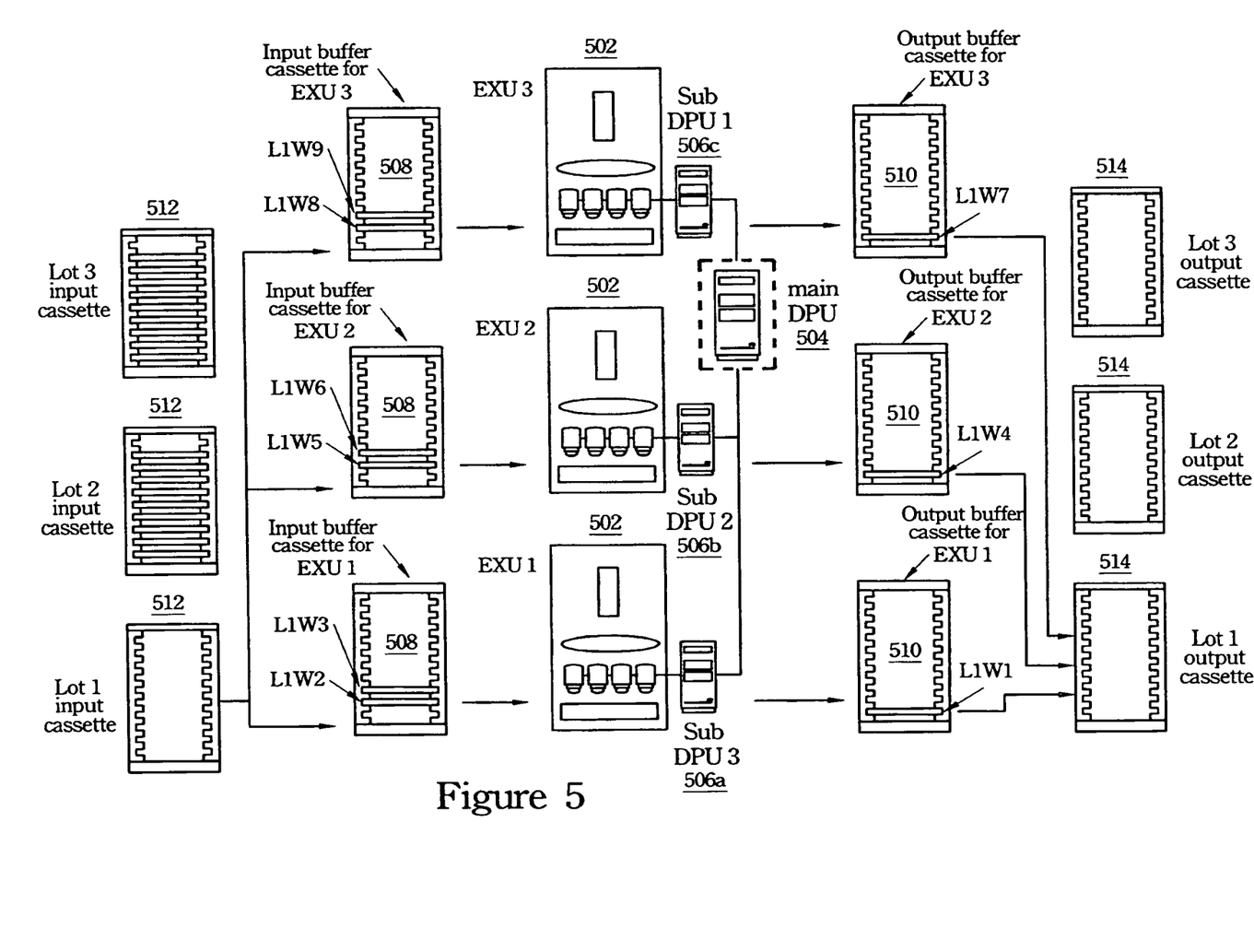
FIG. 5 illustrates another embodiment of an exemplary EXU system of the invention using multiple EXU modules controlled by a single main DPU.

FIG. 5 illustrates another embodiment of an exemplary EXU system 500 of the invention using multiple EXU modules 502a, 502b, & 502c controlled by a single main DPU 504. Each EXU module 502 may also have a sub-DPU 506 associated therewith, where the sub-DPU may function in similar fashion to the sub-DPU described in FIG. 4, i.e., as a local process controller. However, Applicants note that the sub-DPU 506 may be an optional element of the system 500. System 500 also includes input cassettes 512, input buffer cassettes 508, output buffer cassettes 510, and output cassettes 514. The number of input and output buffer cassettes may be determined in accordance with the processing and system requirements, but in the current exemplary embodiment, there are equal numbers of EXU modules 502 and input/output buffer cassettes 508/510. In some embodiments, the number of input or output buffer cassettes may be greater than the number of EXU modules 502. The system 500 also includes substrate transfer mechanisms configured to move substrates between the cassettes and the EXU processing station.

In operation, system 500 uses one main DPU 504 to provide writing instructions to three EXU modules 506. The main DPU 50 sends the same writing instruction to all three main EXU modules 502 to write three wafers in the same lot simultaneously. This particular example shows substrates L1W1, L1W2, and L1W3 loaded to the input buffer cassette of EXU module #1 502a, the next three substrates loaded to the input buffer cassette of EXU module #2 502b, and the final three substrates loaded into the input buffer cassette of EXU module #3 502c. As a result, L1W1, L1W4, and L1W7 are written simultaneously from one single DPU writing instruction. Similarly, substrates L1W2, L1W5, and L1W8 are written next simultaneously, again using an identical writing instruction. Although the writing instruction for the first group of substrates written by the EXU modules will generally be the same as the writing instruction for the next group of substrates, embodiments of the invention are configured such that the writing instructions may be different between substrate processing groups.

Once the group of substrates has been processed, the substrates are simultaneously moved from the EXU modules 502 and into an output buffer cassette 510 associated with the EXU module 502 from which the substrate came from. Thereafter, the substrates are transferred to an output cassette 514 and rearranged into the normal sequence (or another sequence that may be selected and programmed into the system 500) from L1W1 to L1W9 in the Lot 1 output cassette. The substrate transfer process may be conducted during the exposure process (resulting in increased throughput), after all wafers are collected in the buffer cassettes, or during a combination of both.

In the embodiment of the invention illustrated in FIG. 5, the sub-DPUs 506a, 506b, & 506c do not operate to generate writing instructions or to read GDF data. Rather, the sub DPUs 506 operate to monitor and control the local operation of the associated EXU modules 502

Figure 6:
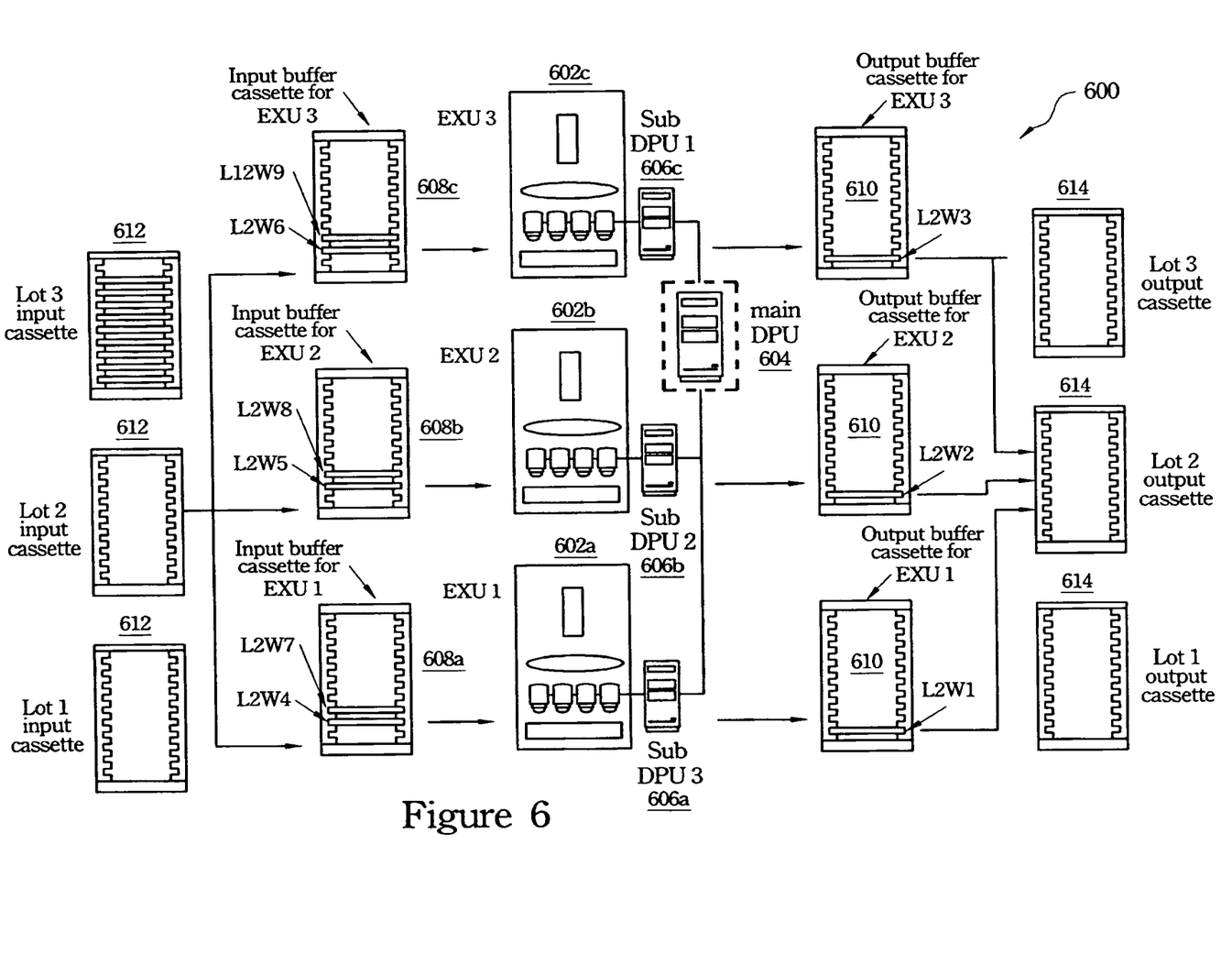
FIG. 6 illustrates another embodiment of an exemplary EXU system of the invention using multiple EXU modules controlled by a single DPU.
Figure 7:
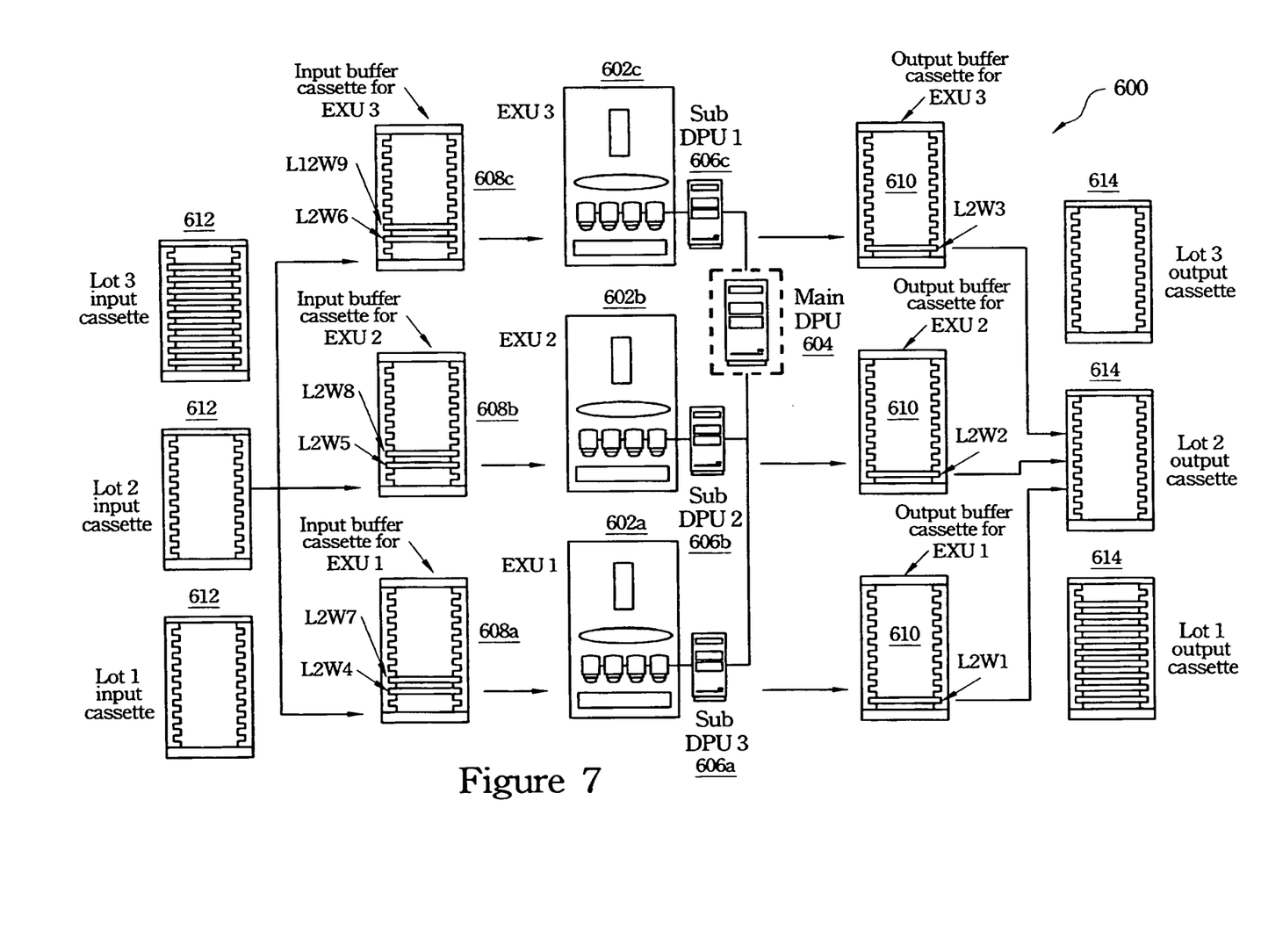
FIG. 7 illustrates a process snapshot of the exemplary EXU system shown in FIG. 6 once a first lot of substrates has completed processing and while a second lot of substrates is being processed.

FIG. 6 illustrates another exemplary embodiment of the invention. In the system 600 illustrated in FIG. 6, substrates L1W1, L1W4, and L1W7 are loaded into the input buffer cassette 608a of EXU1 602a; L1W2, L1W5, and L1W8 are loaded into the input buffer cassette for EXU2 608b, and L1W3, L1W6, and L1W9 are loaded into the input buffer cassette for EXU3 608c. In the method of this embodiment, substrates L1W1, L1W2, L1W3 are exposed simultaneously, and then transferred to the output buffer cassettes 610, and then subsequently to the output cassette 614 of Lot 1. This sequence is repeated until the entirety of lot 1 has been processed and transferred to the output cassette 614. FIG. 7 illustrates a process snapshot of the exemplary EXU system shown in FIG. 6 once a first lot of substrates has completed processing and while a second lot of substrates is being processed using a similar sequence as that used for the first lot. As such, the situation of system 600 after finishing Lot 1 and during exposure of Lot 2, is shown in FIG. 7.

In another embodiment of the invention, the input and output buffer cassettes may be eliminated by using single substrate input/output areas to take/deposit substrates from the input/output cassettes. Reordering the input substrates into input buffer cassettes is preferred, to save the waiting time for the substrates to be exposed simultaneously, because the waiting time reduces substrate throughput. Whereas, the output buffer cassettes can be eliminated without affecting substrate throughput, because the output substrates can be loaded into the output cassette sequentially while the substrates are still being exposed. The exposure sequence shown in the exemplary embodiments of FIGS. 6 and 7 facilitates elimination of the output buffer cassettes. Alternately, the input buffer cassettes can be eliminated by creating a wafer-loading position in front of each EXU. Wafers can be pre-loaded from the input cassettes into these waiting positions while the exposure of the previous wafer is proceeding.

Figure 8:
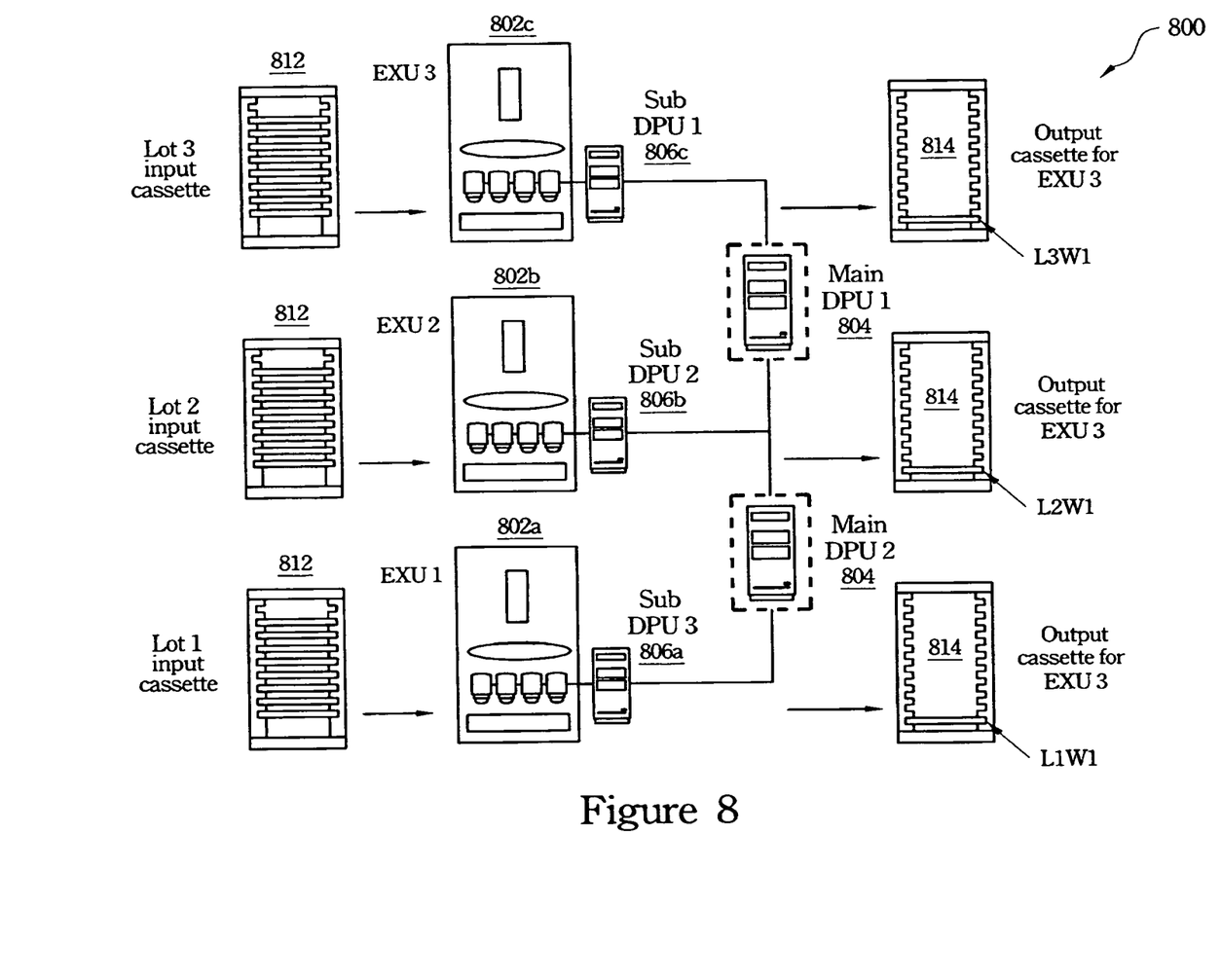
FIG. 8 illustrates an exemplary substrate dispatching scheme of the invention.

In another exemplary embodiment of the invention, when the substrate lots are to be exposed with at least one identical pattern, an exemplary substrate dispatching system 800 (or method) as shown in FIG. 8 can be used. System 800 includes input cassettes 812, EXUs 802*a*, 802*b*, & 802*c*, main DPUs 804, sub-DPUs 806*a*, 806*b*, and 806*c*, and output cassettes 814. In system 800, when the number of substrates to be exposed is not an integer multiple of the number of the EXU modules available for processing in the system, then some EXU modules may be idling during exposure of a residual number (remainder of the integer number divided by the number of EXU modules) of substrates. In this situation, another DPU can send writing instructions of a different pattern to the otherwise idling EXUs to process other lots of substrates to maintain productivity. This ability is useful even when only one lot of wafers needs to be exposed with one pattern, as long as the number of wafers to be exposed is not an integer multiple of the number of the EXU modules. Further, when there are more or an equal number of lots with an identical pattern to expose than the number of EXU modules, it is possible to eliminate the buffer cassettes as also shown in the exemplary embodiment of the invention illustrated in FIG. 8.

For convenience of illustration only, the number of substrates in a lot was chosen to be nine and the number of EXU modules in a system was chosen to be three. However, in embodiments of the invention, the actual number of substrates in a lot will generally vary between 1 and 50, and there is no fundamental reason why more than 50 substrates cannot be in a single lot or cassette. Similarly, the number of EXU modules sharing one DPU can be up to the number of substrates in a lot. Additionally, wafers, display panels, and any other type of semiconductor processing surface may be used in embodiments of the invention. Further, in embodiments of the invention, the EXU modules may use photons, electrons, ions, ink drops, or any other known method for writing a desired pattern onto a substrate.

Embodiments of the invention generally provide an apparatus or system for direct write patterning that includes a cluster of a plurality of direct-writing exposure units, wherein the EXUs are controlled by at least one main data-processing unit to write more than one substrate with each EXU. The direct exposure units generally include a selectively movable substrate holder, an exposure source, and an apparatus for focusing an imaging beam emitted from the exposure source onto a substrate position on the substrate holder. The exposure source may be configured to generate electrons, ions, or photons, for example. The direct exposure units may also include an ink drop patterning device. The system may further be configured to write more than one substrate, which may be a semiconductor wafer, mask, or substrate for display applications, at substantially the same time. The system may also include a plurality "m" of EXU modules and a plurality of "N" main DPUs in communication with the EXU modules, where "m" is greater than "n".

Embodiments of the invention may further provide a direct write cluster system that includes at least one input cassette configured to hold substrates before the substrate is processed by an EXU, and at least one output cassette configured to hold substrates post processing in the EXU. The input cassette may be configured to output substrates to at least one buffer cassette positioned between the input cassette and the EXU for staging or buffering the substrates being processed by multiple EXUs. The output cassette may include a buffer cassette positioned between the output cassette and an output of the EXU to receive and buffer processed substrates before they are arranged in the output cassette.

Embodiments of the invention may further provide a method or process of patterning more than one substrate by a direct write cluster (DWC) using a plurality of direct-writing exposure units (EXU) and at least one main DPU. The method or process may include providing at least one input cassette, providing at least one output cassette, distributing the substrates in a lot to more than one EXU driven by at least one main DPU for exposure, and assembling exposed wafers from more than one EXU driven by at least one main DPU into the at least one output cassette. In the exemplary method of the invention, the substrate may be a semiconductor wafer, a mask, or a display-type substrate. The method may further include using at least one input buffer cassette and at least one output buffer cassette, the output cassette being configured such that the output substrates may be loaded into the output cassette in the original lot sequence after processing (via the output buffer cassette). Additionally, the method may further include using "m" plurality of EXUs and "n" plurality of DPUs, where "m" is greater than "n".

Another exemplary embodiment of the invention provides a DWC system that includes a cluster of more than one direct-writing unit controlled by at least one main data-processing unit to write more than one substrate simultaneously, one with each of the plurality of exposure units. The system may use substrates that are semiconductor wafers, masks, or substrates for display applications. The direct writing unit may use electrons, photons, ions, or ink drops to write the pattern. The DWC may include more than one sub-data processing unit, and the DWC may further include at least one input cassette to hold the substrate before sending to the EXU, at least one input buffer cassette, at least one output cassette to hold the substrate after patterning with the EXU, and at least one output buffer cassette.

Another exemplary embodiment of the invention may provide a method of patterning more than one substrate simultaneously using a corresponding number of EXU and at least one main DPU. The substrate may be a semiconductor wafer, substrate, or flat panel display substrate. The method may use at least one input cassette, where the input cassette may include least one buffer cassette. The method may further include at least one output cassette, wherein the output cassette may include at least one buffer cassette. The method may further use a plurality of "m" EXUs and a plurality of "n" DPUs, wherein the number "m" is greater than "n". The method may further include distributing substrates in a lot to more than one EXU driven by at least one main DPU for simultaneous exposure. Further, the method may include assembling simultaneously exposed wafers from more than one EXU driven by at least one main DPU, into a cassette. The method may further include loading the input wafers according to their original lot sequence before distribution for simultaneous exposure.

The foregoing outlines features of several embodiments so that those skilled in the art may better understand the aspects of the present disclosure. Those skilled in the art will generally appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

I claim:

1. A system for direct write patterning, comprising:
   first and second direct write exposure units;
   a single data processing unit in communication with the first and second direct write exposure units, the single data processing unit being configured to generate a common writing instruction based on pattern data and send the common writing instruction to each of the first and second direct write exposure units;
   a first sub-data processing unit communicatively positioned between the single data processing unit and the first direct write exposure unit and configured to fine-tune the common writing instruction for the first direct write exposure unit based on variations between the first and second direct write exposure units;
   a second sub-data processing unit communicatively positioned between the single data processing unit and the second direct write exposure unit and configured to fine-tune the common writing instruction for the second direct write exposure unit based on the variations between the first and second direct write exposure units;
   wherein the common writing instruction includes on-off stream information and stage movement information;
   wherein the first sub-data processing unit is further configured to fine-tune the on-off stream information for an imaging beam in the first direct write exposure unit and fine-tune the stage movement information for a substrate stage in the first direct write exposure unit;
   at least one input cassette in communication with each of the first and second direct write exposure units;
   at least one output cassette in communication with each of the first and second direct write exposure units;
   first and second input buffer cassettes respectively associated with the first and second direct write exposure units and respectively positioned between each of the at least one input cassettes and the first and second direct write exposure units; and
   first and second output buffer cassettes respectively associated with the first and second direct write exposure units and respectively positioned between each of the at least one output cassettes and the first and second direct write exposure units.

2. The system of claim 1, wherein each of the first and second direct write exposure units comprise:
   a movable substrate holder;
   an exposure source; and
   an apparatus for focusing an imaging beam emitted from the exposure source onto a substrate positioned on the selectively movable substrate holder.

3. The system of claim 2, wherein the exposure source is configured to generate electrons, ions, or photons for use in patterning.

4. The system of claim 1, wherein the first and second direct write exposure units comprise ink drop patterning devices.

5. The system of claim 1, wherein the patterning is conducted on a semiconductor wafer, semiconductor substrate, mask, or substrate used for display applications.

6. The system of claim 1, comprising M exposure units and N data processing units, where M and N are both integers and M is greater than N.

7. A direct write cluster tool, comprising:
   first and second direct write exposure units configured to write a pattern directly onto substrates;
   a main data processing unit in communication with the first and second direct write exposure units and configured to generate a common writing instruction based on pattern data associated with the pattern; and
   first and second input buffer cassettes respectively associated with the first and second direct write exposure units and first and second output buffer cassettes respectively associated with the first and second direct write exposure units;
   a first sub-data processing unit configured to fine-tune the common writing instruction for the first direct write exposure unit based on variations between the first and second direct write exposure units; and
   a second sub-data processing unit configured to fine-tune the common writing instruction for the second direct write exposure unit based on the variations between the first and second direct write exposure units;
   wherein the common writing instruction includes on-off stream information and stage movement information;
   wherein the first sub-data processing unit is further configured to fine-tune the on-off stream information for an imaging beam in the first direct write exposure unit and fine-tune the stage movement information for a substrate stage in the first direct write exposure unit.

8. The direct write cluster tool of claim 7, wherein the main data processing unit sends the common writing instruction to each of the first and second direct write exposure units simultaneously.

9. The direct write cluster tool of claim 7,
   further comprising an input cassette in communication with the first and second input buffer cassettes, the first and second input buffer cassettes being respectively positioned between the input cassette and the first and second direct write exposure units; and
   further comprising an output cassette in communication with the first and second output buffer cassettes, the first and second output buffer cassettes being respectively positioned between the first and second direct write exposure units and the output cassette.

10. The direct write cluster tool of claim 7, further comprising M direct write exposure units and N main data processing units, where M and N are both integers and M is greater than N.

11. The system of claim 7,
    wherein the first and second input buffer cassettes are operable to stage substrates immediately before the substrates are respectively exposed by the first and second direct write exposure units; and
    wherein the first and second output buffer cassettes are operable to temporarily store substrates immediately after the substrates have been respectively exposed by the first and second direct write exposure units.

12. A method for processing substrates, comprising:
    receiving first and second substrates in first and second direct write exposure units, respectively;
    generating a common writing instruction based on pattern data with a single main data processing unit in communication with the first and second direct write exposure units, the common writing instruction including on-off stream information and stage movement information;
    transmitting the common writing instruction to each of the first and second direct write exposure units;
    fine-tuning the common writing instruction for the first direct write exposure unit based on variations between the first and second direct write exposure units;
    fine-tuning the common writing instruction for the second direct write exposure unit based on the variations between the first and second direct write exposure units;

writing the first substrate in the first direct write exposure unit in accordance with the common writing instruction fine-tuned for the first direct write exposure unit; and writing the second substrate in the second direct write exposure unit in accordance with the common writing instruction fine-tuned for the second direct write exposure unit;

wherein the fine-tuning the common writing instruction for the first direct write exposure unit includes fine-tuning the on-off stream information for an imaging beam in the first direct write exposure unit and fine-tuning the stage movement information for a substrate stage in the first direct write exposure unit;

processing a substrate lot through the first and second direct write exposure units via an input buffer and an output buffer each in communication with each of the first and second direct write exposure units.

13. The method of claim 12, wherein writing of the first and second substrates in direct write exposure units is conducted substantially simultaneously.

14. The method of claim 12, further comprising M direct write exposure units and N main data processing units, where M and N are both integers and M is greater than N.

15. The method of claim 12,
wherein the fine-tuning the common writing instruction for the first direct write exposure unit is performed with a first sub-data processing unit communicatively positioned between the single main data processing unit and the first direct write exposure unit; and
wherein the fine-tuning the common writing instruction for the second direct write exposure unit is performed with a second sub-data processing unit communicatively positioned between the single main data processing unit and the second direct write exposure unit.

16. A system for direct write processing, comprising:
first and second means for direct write exposing substrates;
a processing control means for generating a common writing instruction based on pattern data and sending the common writing instruction to the first and second means for direct write exposing substrates, the processing control means being in communication with each of the first and second means for direct write exposing substrates; and substrate input buffer means in communication with each of the first and second means for direct write exposing substrates;

substrate output buffer means in communication with each of the first and second means for direct write exposing substrates;

first sub-processing control means for fine-tuning the common writing instruction for the first direct write exposure means based on variations between the first and second direct write exposure means; and second sub-processing control means for fine-tuning the common writing instruction for the second direct write exposure means based on the variations between the first and second direct write exposure means;

wherein the common writing instruction includes on-off stream information and stage movement information;

wherein the first sub-processing control means is further configured to fine-tune the on-off stream information for an imaging beam in the first means for direct write exposing substrates and fine-tune the stage movement information for a substrate stage in the first means for direct write exposing substrates.

17. The system of claim 16, wherein the first and second means for direct write exposing substrates are configured to simultaneously process substrates, the first means for direct write exposing substrates being configured to process substrates using the common writing instruction fine-tuned by the first sub-processing control means and the second means for direct write exposing substrates being configured to process substrates using the common writing instruction fine-tuned by the second sub-processing control means.

18. The system of claim 16, further comprising M means for direct write exposing substrates and N processing control means, where M and N are both integers and M is greater than N.

* * * * *